United States Patent
Wu et al.

(10) Patent No.: US 9,659,881 B2
(45) Date of Patent: May 23, 2017

(54) SEMICONDUCTOR STRUCTURE INCLUDING A SUBSTRATE AND A SEMICONDUCTOR CHIP WITH MATCHING COEFFICIENTS OF THERMAL EXPANSION

(71) Applicant: TAIWAN SEMICONDUCTOR MANUFACTURING COMPANY LTD., Hsinchu (TW)

(72) Inventors: Jiun Yi Wu, Taoyuan County (TW); Yu-Min Liang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/491,465

(22) Filed: Sep. 19, 2014

(65) Prior Publication Data

US 2016/0086893 A1    Mar. 24, 2016

(51) Int. Cl.
*H01L 23/14* (2006.01)
*H01L 23/00* (2006.01)
*H01L 23/498* (2006.01)

(52) U.S. Cl.
CPC .......... *H01L 23/562* (2013.01); *H01L 23/145* (2013.01); *H01L 23/49816* (2013.01); *H01L 23/49822* (2013.01); *H01L 2224/16225* (2013.01); *H01L 2924/15174* (2013.01); *H01L 2924/15184* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 2002/0117743 A1* | 8/2002 | Nakatani | H01L 21/4857 257/687 |
| 2003/0148109 A1* | 8/2003 | Timberlake | B32B 15/04 428/417 |
| 2003/0178726 A1* | 9/2003 | Ogawa | H01L 21/4857 257/758 |
| 2005/0116354 A1* | 6/2005 | Kashiwazaki | H01L 23/49816 257/779 |
| 2007/0111578 A1* | 5/2007 | Langon | H01R 12/52 439/300 |
| 2009/0179316 A1* | 7/2009 | Wang | H01L 21/568 257/676 |

(Continued)

OTHER PUBLICATIONS http://www.sunstone.com/pcb-capabilities/pcb-manufacturing-capabilities/pcb-materials/fr-4-materia (as of Oct. 26, 2016).*

*Primary Examiner* — Michael Jung
*Assistant Examiner* — Jay C Chang
(74) *Attorney, Agent, or Firm* — WPAT, P.C., Intellectual Property Attorneys; Anthony King

(57) ABSTRACT

A semiconductor structure and a method for forming the same are provided. The semiconductor structure includes: a substrate comprising a recess portion filled with a conductive material; a conductive trace overlying and contacting the conductive material; a conductive pillar disposed on the conductive trace and over the recess portion of the substrate; and a semiconductor chip disposed on the conductive pillar, wherein the elastic modulus of the substrate is of about 3 to about 10 GPa at about 20 to about 30° C. and of about 1 to about 5 GPa at about 250 to about 270° C.

19 Claims, 16 Drawing Sheets

(56) References Cited

U.S. PATENT DOCUMENTS

| | | | |
|---|---|---|---|
| 2009/0289350 A1* | 11/2009 | Watanabe | H01L 23/16 257/701 |
| 2010/0018762 A1* | 1/2010 | Yoshimura | H05K 1/036 174/262 |
| 2010/0044081 A1* | 2/2010 | Morimoto | H01L 21/4857 174/251 |
| 2013/0069251 A1* | 3/2013 | Kunimoto | H01L 23/49822 257/784 |
| 2013/0299986 A1* | 11/2013 | Sun | H01L 23/49894 257/741 |

* cited by examiner

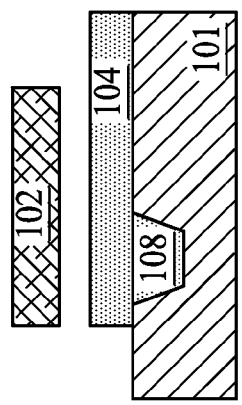
FIG. 14A
FIG. 14B
FIG. 14C
FIG. 14D
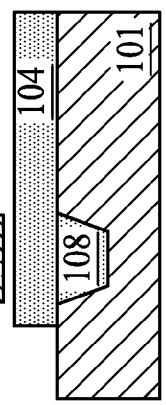
FIG. 14E
FIG. 14F
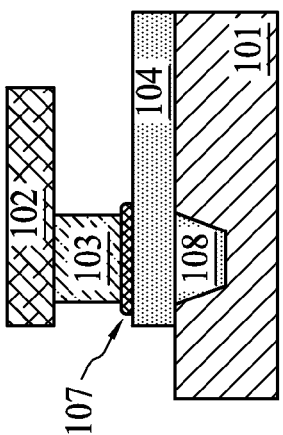
FIG. 14G

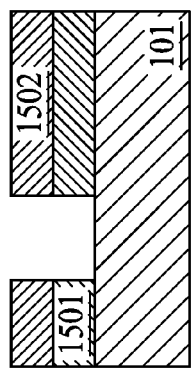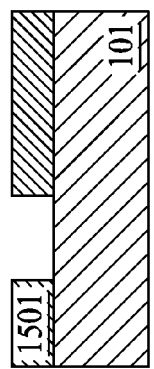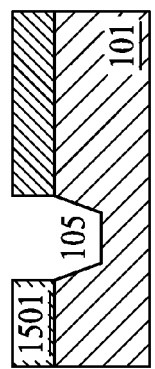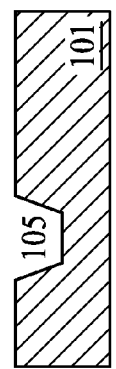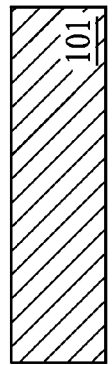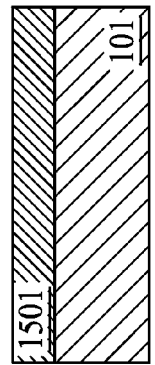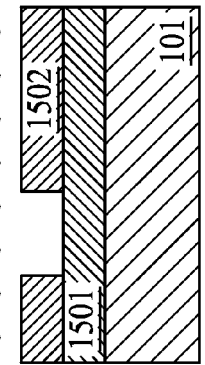

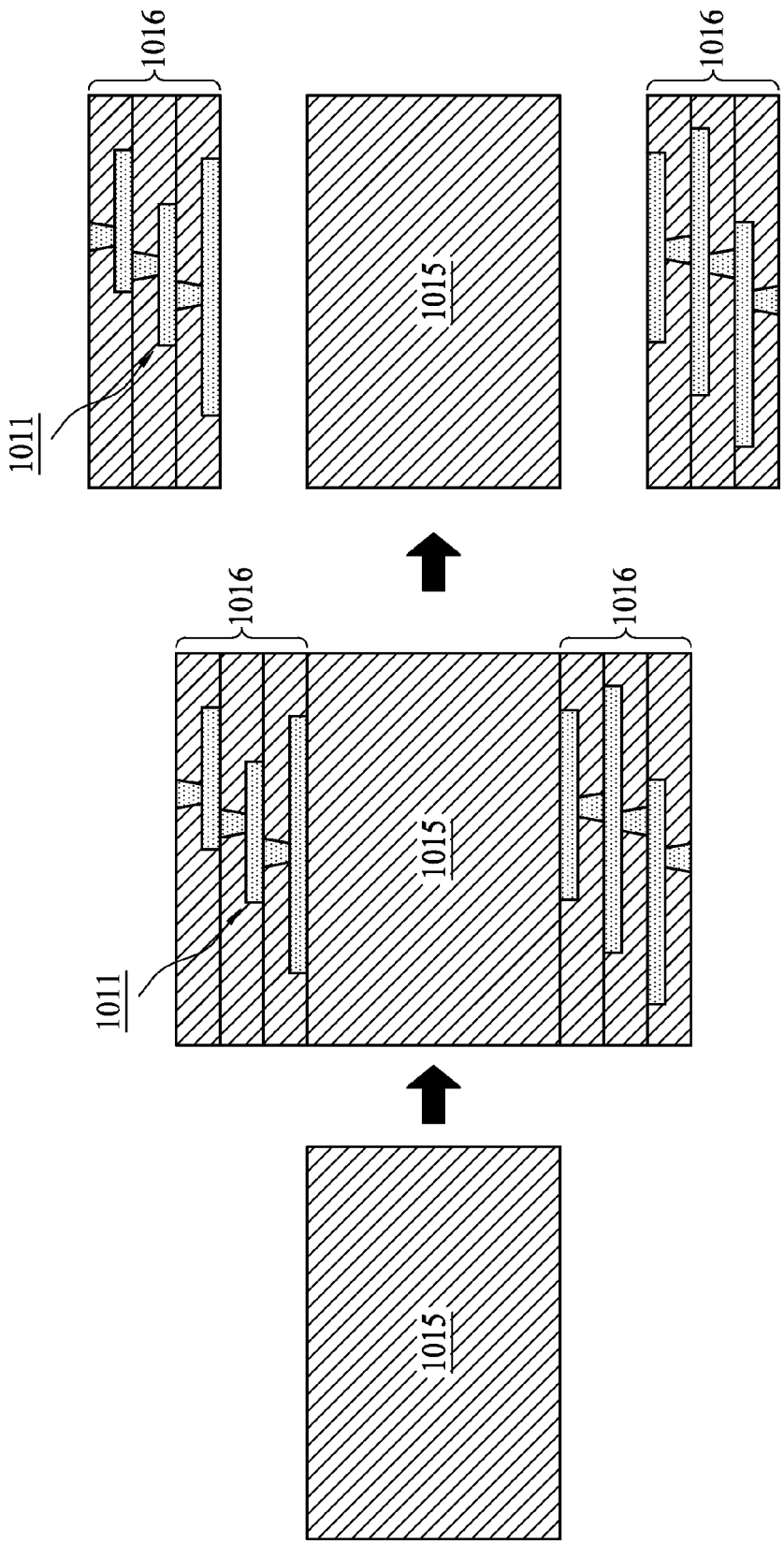

SEMICONDUCTOR STRUCTURE INCLUDING A SUBSTRATE AND A SEMICONDUCTOR CHIP WITH MATCHING COEFFICIENTS OF THERMAL EXPANSION

FIELD

The present disclosure relates generally to a semiconductor structure and more particularly relates to a semiconductor structure comprising a low modulus substrate.

BACKGROUND

Since the invention of integrated circuits, the semiconductor industry has experienced continuous rapid growth due to constant improvements in the integration density of various electronic components (i.e., transistors, diodes, resistors, capacitors, etc.) and semiconductor packages. For the most part, these improvements in integration density have come from repeated reductions in minimum feature size, allowing more components to be integrated into a semiconductor chip or package.

One approach for allowing more components to be integrated into a semiconductor package is the adoption of flip chip structures, in which a semiconductor chip is bonded to a substrate with conductive bumps and also the semiconductor chip is "flipped" onto the active circuit surface. Such flip chip package has a problem that it is subject to different temperatures during the packaging process. As a result, the package is highly stressed due to the different coefficients of thermal expansion (CTE) of the various package substrate and chip materials, which in turn may cause the substrate to bow, warp or crack. Accordingly, what is needed are package structures that can control package warpage (e.g., co-planarity) within acceptable limits and that absorb the package's internal stresses to enhance the reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14A-14G schematically illustrate a method of manufacturing a semiconductor structure in accordance with some embodiments of the present disclosure.

FIGS. 15A-15G schematically illustrate a method for forming a recess portion on a surface of a substrate in accordance with some embodiments of the present disclosure.

FIGS. 16A-16C schematically illustrate a method for receiving a coreless substrate in accordance with some embodiments of the present disclosure.

DETAILED DESCRIPTION

Figure 1A:
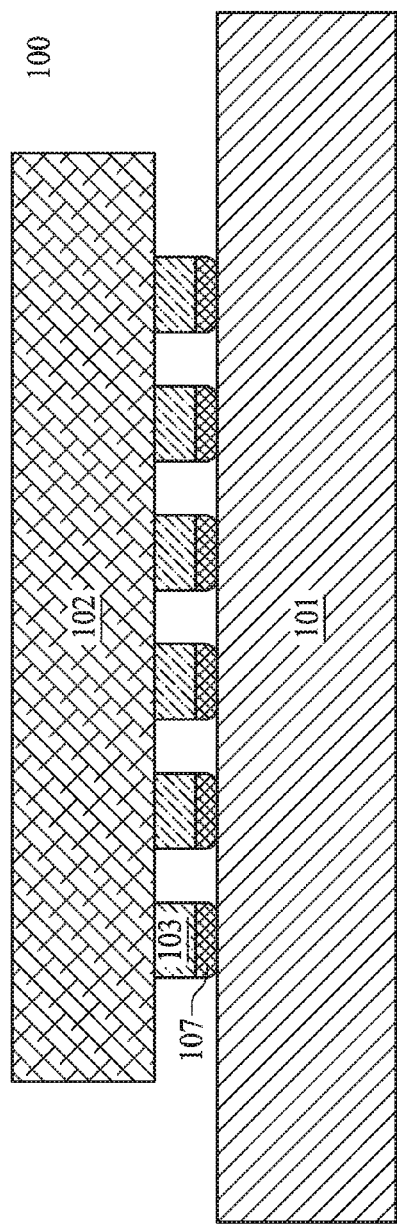
FIG. 1A is a cross-sectional view illustrating a conventional semiconductor structure 100 in flip chip configuration

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps (operations) and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In reference to the drawings, FIG. 1A is a cross-sectional view illustrating a conventional semiconductor structure 100 in flip chip configuration (as known as controlled collapse chip connection or C4). Compared with packaging techniques such as wire bonding and tape automatic bonding (TAB), a flip-chip package has shorter signal transmission path between the semiconductor chip and the substrate and thus it has better electrical properties. In addition, a flip-chip package may be designed to expose the back surface of the semiconductor chip (one of the mains surface not facing the substrate) so as to increase heat dissipation rate. According to FIG. 1A, the semiconductor structure 100 comprises a semiconductor chip 102 and a substrate 101. The semiconductor chip 102 may be bonded directly to the substrate 101 with conductive bumps 103 and conductors 107 (e.g., solder). During packaging, the semiconductor chip 102 is "flipped" onto the active circuit surface so that the conductive bumps 103 form electrical and mechanical connections between the semiconductor chip 102 and the substrate 101. Underfill (not shown) is then applied between the gap formed by the conductive bumps 103 to further secure the semiconductor chip 102 to the substrate 101.

Figure 1B:
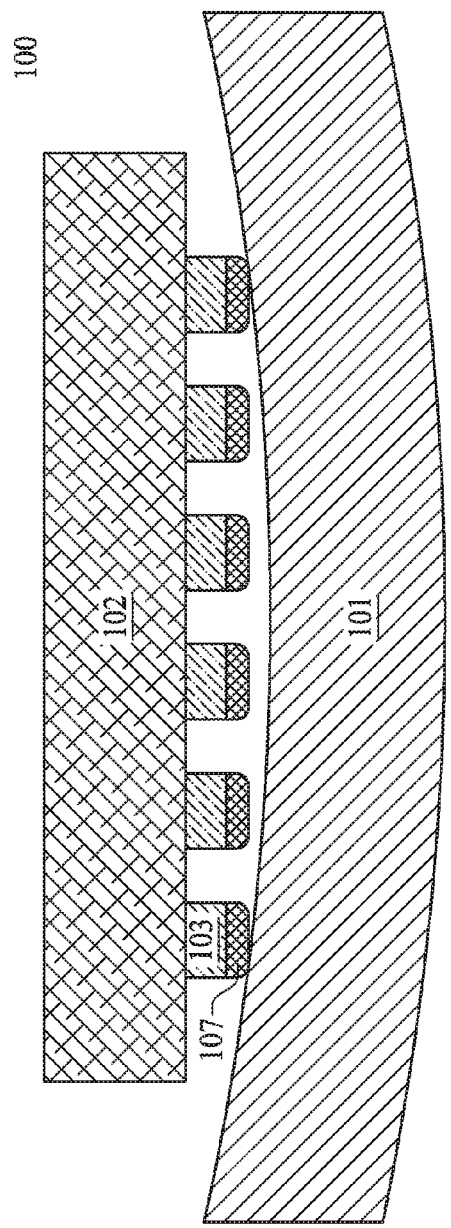
FIG. 1B is a cross-sectional view illustrating a conventional semiconductor structure 100 in high temperature

Such flip chip package has a problem that it is subject to different temperatures during the packaging process. For instance, different temperatures arise with the cool down from the solder joining temperature and the underfill curing temperature. The result is that the package is highly stressed due to the different coefficients of thermal expansion (CTE) of the various package substrate and chip materials. Since the conventional organic material for the substrate 101 is generally of low coefficient of thermal expansion, highly rigidity and high elastic modulus, the high stress experienced by the substrate 101 in high temperature or during cooling may cause the substrate 101 to bow (see FIG. 1B, the substrate 101). This problem is worsened in the case of a relatively large chip. In some cases, the warpage (or bow) of the package will exceed the co-planarity specification for the semiconductor chip 102. Accordingly, what is needed are package structures that can control package warpage (e.g., co-planarity) within acceptable limits and that absorb the package's internal stresses to enhance the reliability.

Figure 2:
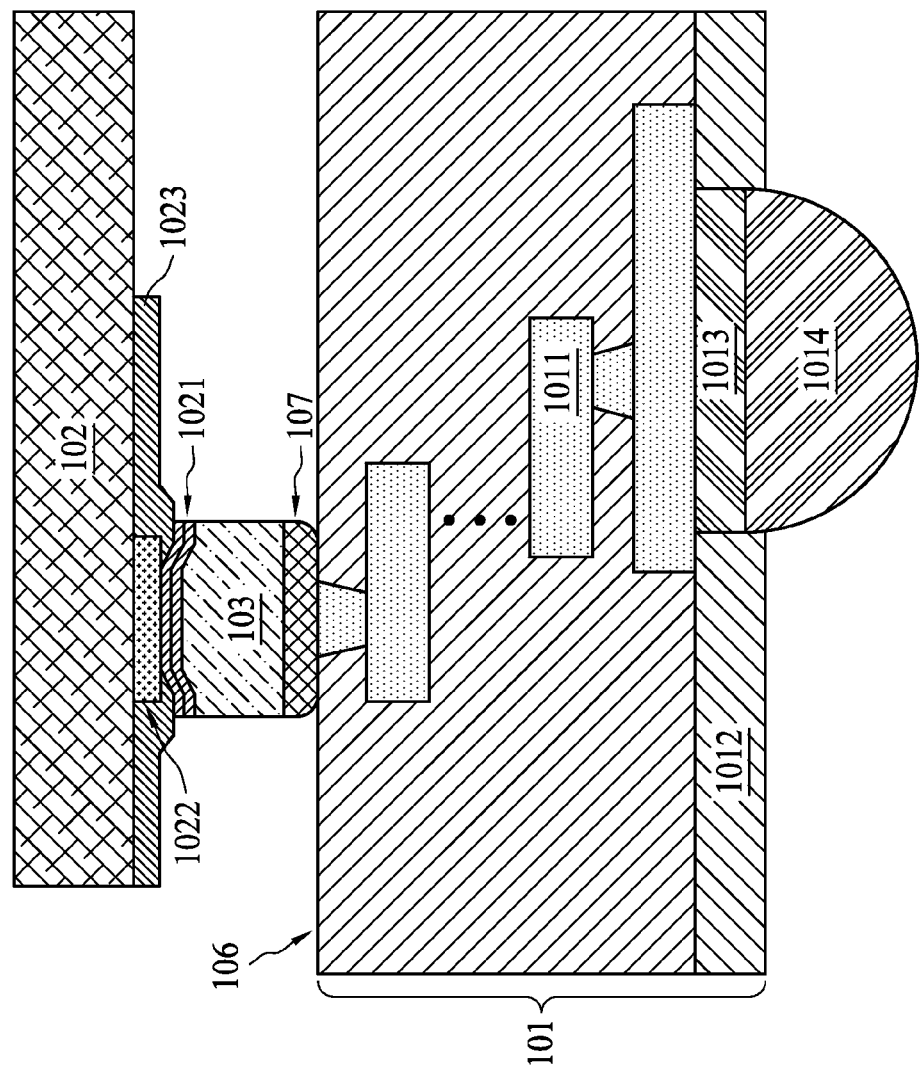
FIG. 2 is a cross-sectional view illustrating a semiconductor structure in accordance with some embodiments of the present disclosure.

To this end, the present disclosure provides a semiconductor structure comprising a substrate made of low CTE and low elastic modulus organic material. FIG. 2 is a schematic diagram illustrating a semiconductor structure 200 in accordance with some embodiments of the present disclosure. The semiconductor structure 200 includes a substrate 101, a semiconductor chip 102 and a conductive bump 103 by which the semiconductor chip 102 and the substrate 101 are coupled together. The conductive bump 103 can provide an electrical conduction path, a thermal conduction path and a mechanical connection between the semiconductor chip 102 and the substrate 101. The conductive bump 103 may be coupled to the electrically connecting portions (not shown) on or of the substrate 101 with a conductor 107. In some embodiments, the conductor 107 may be made of a lead-free solder, a eutectic solder, or the like.

In some embodiments, the semiconductor chip 102 may comprise logic devices, eFlash device, memory device, microelectromechanical (MEMS) devices, analog devices, CMOS devises, combinations of these, or the like. In some embodiments, coupling the semiconductor chip 102 to the conductive bump 103 comprises the following steps. First, a bond pad 1022 and a passivation layer 1023 (which is generally made of a polyimide material) are formed sequentially on the semiconductor chip 102, wherein the passivation layer 1023 exposes a portion of the bond pad 1022. An under bump metallurgy (UBM) structure 1021 is then formed over the exposed portion of the bond pad 1022 and the passivation layer 1023. At the final operation, the conductive bump 103 is coupled to the UBM structure 1021, thereby electrically connecting the semiconductor chip 102 and conductive bump 103.

In some embodiments, the UBM structure 1021 comprises a metallic adhesive layer forming on the bond pad 1022, a barrier layer for preventing diffusion, and a solder wettable layer for connecting the conductive bump 103. The UBM structure 1021 provides functions such as bump connection, diffusion barrier, proper adhesion and so on between the conductive bump 103 and the bond pad 1022 of the semiconductor chip 102, such that a solder material can be applied to the UBM structure 1021 and is then subjected to a reflow process to form the required conductive bump 103. The UBM structure usually comprises titanium-copper-nickel (Ti—Cu—Ni) metallic layers, and can be fabricated by for example sputtering, evaporation, plating and so on.

In some embodiments, the conductive bump 103 of the present disclosure can be of pillar shape, e.g., a prism or a cylinder and can be made of metal. In some embodiments, the material of the conductive bump 103 is selected from tin, lead, copper, gold, silver, zinc, bismuth, magnesium, antimony, indium and an alloy thereof. Using copper as the material for the conductive bump 103 has the following advantages: compared with conventional solder bump techniques, using copper pillars as the bonding elements not only helps achieve finer pitch with minimum probability of bump bridging but also reduces the capacitance load for the circuits (electronic interconnections). Copper pillars offer higher reliability, improved electrical and thermal performance. While conventional solder bumps collapse during solder reflow, copper pillars retain their shape.

The material(s) for the substrate 101 is such selected that the elastic modulus (Young's modulus) of the substrate 101 is kept relatively low, which allows for more flexibility in the overall connection between the substrate 101 and the semiconductor chip 102 and accordingly helps avoid warpage of the substrate 101. Since the substrate 101 has a lower elastic modulus, expansion or contraction of the substrate 101 due to change in temperature would not change the position of the conductive bump 103, namely the conductive bump 103 would substantially remain in the same position.

The elastic modulus is a number that measures an object or substance's resistance to being deformed elastically when a force is applied to it. The elastic modulus of an object is usually defined as the slope of its stress-strain curve in the elastic deformation region (namely stress divided by strain), wherein stress is the force causing the deformation divided by the area to which the force is applied and strain is the ratio of the change in some dimension (length) parameter caused by the deformation to the original value of the dimension (length) parameter. Elastic modulus describes tensile elasticity, or the tendency of an object to deform along an axis when opposing forces are applied along that axis; it is defined as the ratio of tensile stress to tensile strain.

In some embodiments, the material(s) for the substrate 101 is such selected that the elastic modulus of the substrate 101 is of about 3 to about 10 GPa at about 20 to about 30° C. In some embodiments, the elastic modulus of the substrate 101 is of about 3 to about 4 GPa at about 20 to about 30° C. In some embodiments, the elastic modulus of the substrate 101 is of about 4 to about 6 GPa at about 20 to about 30° C. In some embodiments, the elastic modulus of the substrate 101 is of about 6 to about 10 GPa at about 20 to about 30° C.

In some embodiments, the material(s) for the substrate 101 is such selected that the elastic modulus of the substrate 101 is of about 1 to about 5 GPa at about 250 to about 270° C. In some embodiments, the elastic modulus of the substrate 101 is of about 1 to about 3 GPa at about 250 to about 270° C. In some embodiments, the elastic modulus of the substrate 101 is of about 3 to about 5 GPa at about 250 to about 270° C.

In some embodiments, the material(s) for the substrate 101 is such selected as to reduce the high stress produced due to the different coefficients of thermal expansion of the various package substrate and chip materials. In some embodiments, the coefficient of thermal expansion of the substrate 101 is of about 2 to about 8 ppm/° C. In some embodiments, the coefficient of thermal expansion of the substrate is of about 2 to about 4 ppm/° C. In some embodiments, the coefficient of thermal expansion of the substrate is of about 4 to about 6 ppm/° C. In some embodiments, the coefficient of thermal expansion of the substrate is of about 6 to about 8 ppm/° C. In some embodiments, the coefficient of thermal expansion of the substrate 101 substantially matches the coefficient of thermal expansion of the semiconductor chip 102.

In some embodiments, the material(s) for the substrate 101 can be selected from (but not limited to) epoxy resin, polymercaptan curing agent, or tertiary amine curing acceler. The epoxy resin for the substrate 101 may comprise: novolak-type epoxy resin, cresol-novolak type epoxy resin, triphenol-alkane type epoxy resin, aralkyl-type epoxy resin, aralkyl-type epoxy resin with a biphenyl backbone, biphenyl-type epoxy resin, dicyclopentadiene-type epoxy resin, heterocyclic-type epoxy resin, naphthalene-ring containing epoxy resin, bisphenol-A type epoxy resin, bisphenol-F type epoxy resin, stilbene-type epoxy resin, trimethylolpropane-type epoxy resin, terpene-modified epoxy resin, linear aliphatic epoxy resin obtained by oxidizing the olefin bond with a peroxy acid (such as a peracetic acid), alicyclic epoxy resin, sulfur-containing epoxy resin, or combination thereof, wherein most preferable for use are aralkyl-type epoxy resin with a biphenyl backbone, biphenyl-type epoxy resin, or a similar epoxy resin that contains a biphenyl group.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. In some embodiments, the substrate 101 includes multi-layered substrates, gradient substrates, hybrid orientation substrates, any combinations thereof and/or the like, such that the semiconductor package can accommodate more active and passive components and circuits. Conductive elements 1011 (e.g., conductive plugs, conductive vias, conductive posts, filler materials or conductive traces) are provided to form conductive path in the vertical directions. In some embodiments, solder mask 1012 is positioned on the bottom surface of the substrate 101, surrounding a ball land 1013, which are configured to receive an external terminal, such as a solder ball 1014, for making the external connectors of the semiconductor structure. In some embodiments, the substrate 101 comprises a PCB (Printed Circuit Board).

Figure 3:
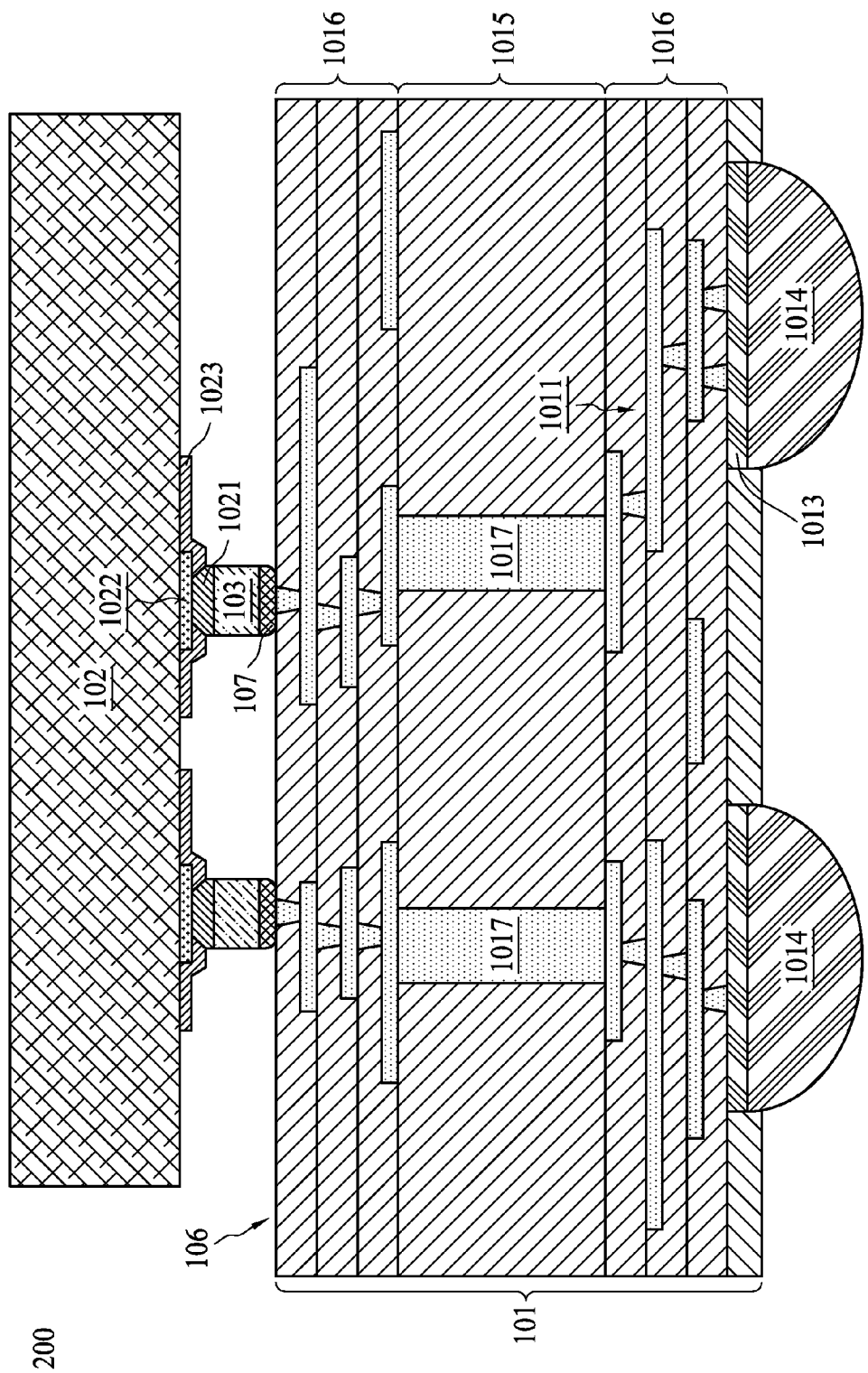
FIG. 3 is a cross-sectional view illustrating a semiconductor structure in accordance with FIG. 2 of the present disclosure.

FIG. 3 is a cross-sectional view illustrating the semiconductor structure 200 of FIG. 2 in accordance with some embodiments of the present disclosure. The substrate 101 comprises a dielectric core structure (layer) 1015 and buildup structures (laminates) 1016 symmetrically disposed on two sides of the core structure 1015. Interconnecting the two buildup structures 1016 through the core structure 1015 is accomplished through plated through holes 1017. The plated through holes 1017 may be formed using either a drill or a laser to cut a holes through the core structure 1015. The plated through holes 1017 may be plated with a conductor such as copper and its alloys, or with other conductive metals and their alloys and may be filled with conductive plugs or filler material. The buildup structures 1016 may comprise a plurality of conducting layers and a plurality of insulating layers. The buildup structures 1016 may comprise conductive elements 1011 (e.g., conductive plugs, or filler materials) for interconnection to the conductive bump 103 or the solder ball 1014.

Figure 4:
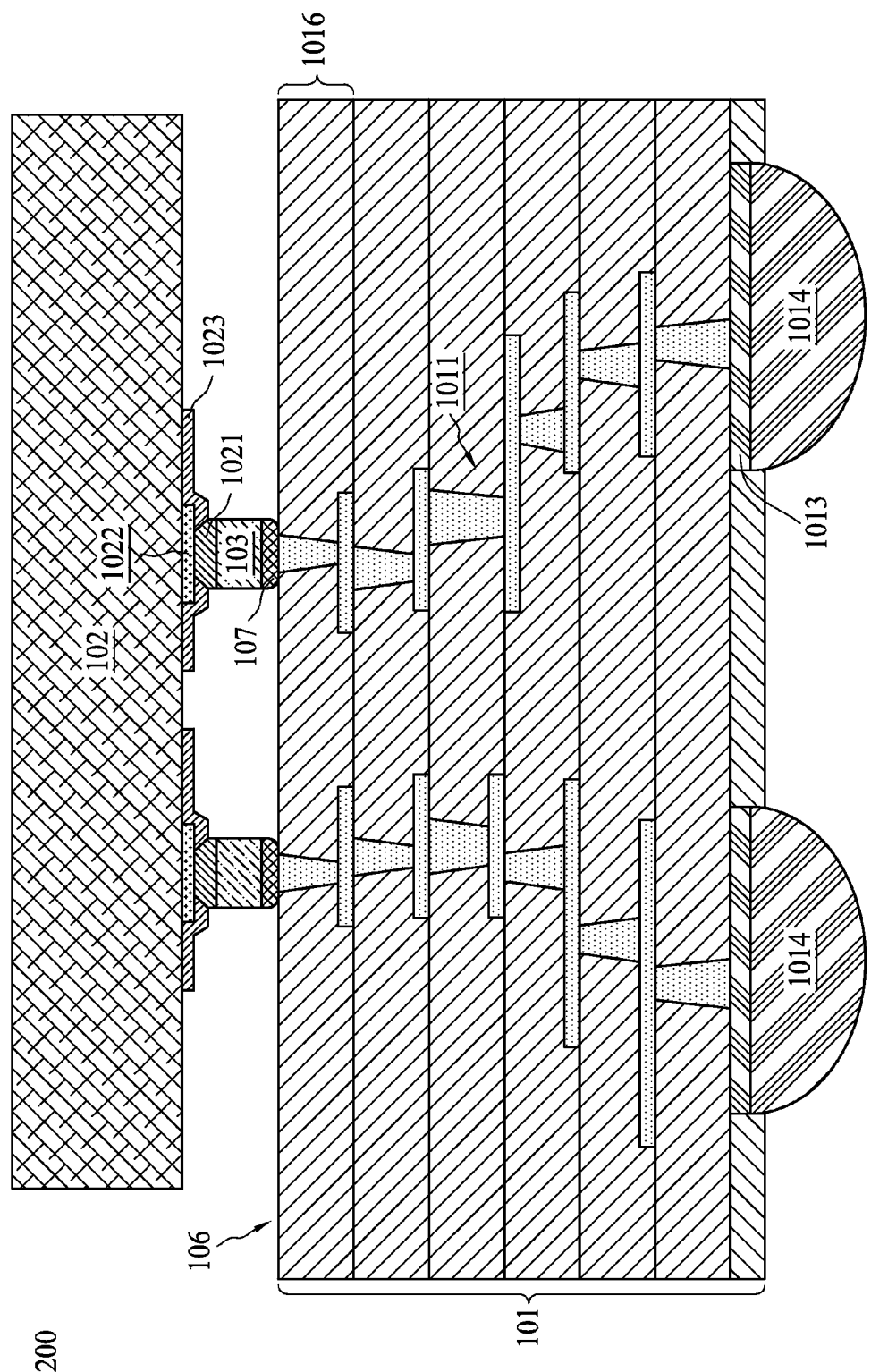
FIG. 4 is a cross-sectional view illustrating a semiconductor structure in accordance with FIG. 2 of the present disclosure.

FIG. 4 is a cross-sectional view illustrating the semiconductor structure 200 of FIG. 2 in accordance with some embodiments of the present disclosure. The substrate 101 comprises a plurality of buildup structures 1016 without a core structure (i.e., the substrate 101 is a coreless substrate). Since the coreless substrate 101 does not have any plating through hole, the wiring density of the coreless package substrate is increased. In addition, the absence of a core structure makes it easy to reduce overall thickness of the substrate 101.

Figure 5:
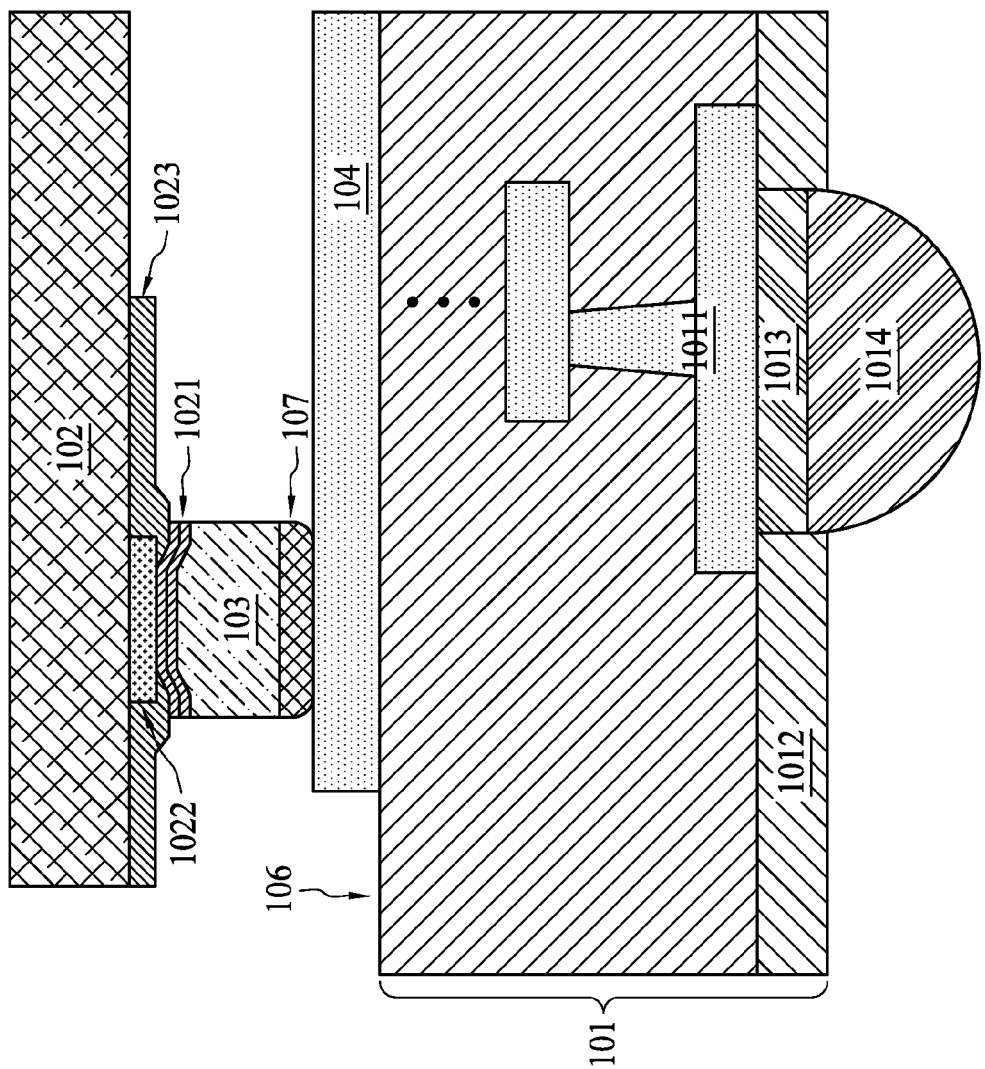
FIG. 5 is a cross-sectional view illustrating a semiconductor structure in accordance with some embodiments of the present disclosure.

FIG. 5 is a cross-sectional view illustrating the semiconductor structure 500 in accordance with some embodiments of the present disclosure. The semiconductor structure 500 includes a substrate 101. A conductive trace 104 is provided on the surface 106 of the substrate 101. A conductive pillar 103 lands on and is coupled to the conductive trace 104. The conductive pillar 103 may be coupled to the conductive trace 104 with a conductor 107. A semiconductor chip 102 and the conductive trace 104 are electrically connected and coupled together by the conductive pillar 103. According to the above Bump-on-Trace (BOT) structures, the conductive trace 104 directly lands on the conductive trace 104 of the substrate 101 instead of being disposed on metal pads (not shown) that have greater widths than the metal traces. The advantages of BOT structures include smaller chip area requirement and low manufacturing cost. In addition, BOT structures have the same reliability as conventional bond structures with metal pads.

In some embodiments, the material(s) for the substrate 101 is such selected that the elastic modulus of the substrate 101 is of about 3 to about 10 GPa at about 20 to about 30° C. In some embodiments, the material(s) for the substrate 101 is such selected that the elastic modulus of the substrate 101 is of about 1 to about 5 GPa at about 250 to about 270° C. In some embodiments, the material(s) for the substrate 101 is such selected as to reduce the high stress produced due to the different coefficients of thermal expansion of the various package substrate and chip materials. In some embodiments, the coefficient of thermal expansion of the substrate 101 is of about 2 to about 8 ppm/° C.

Figure 6:
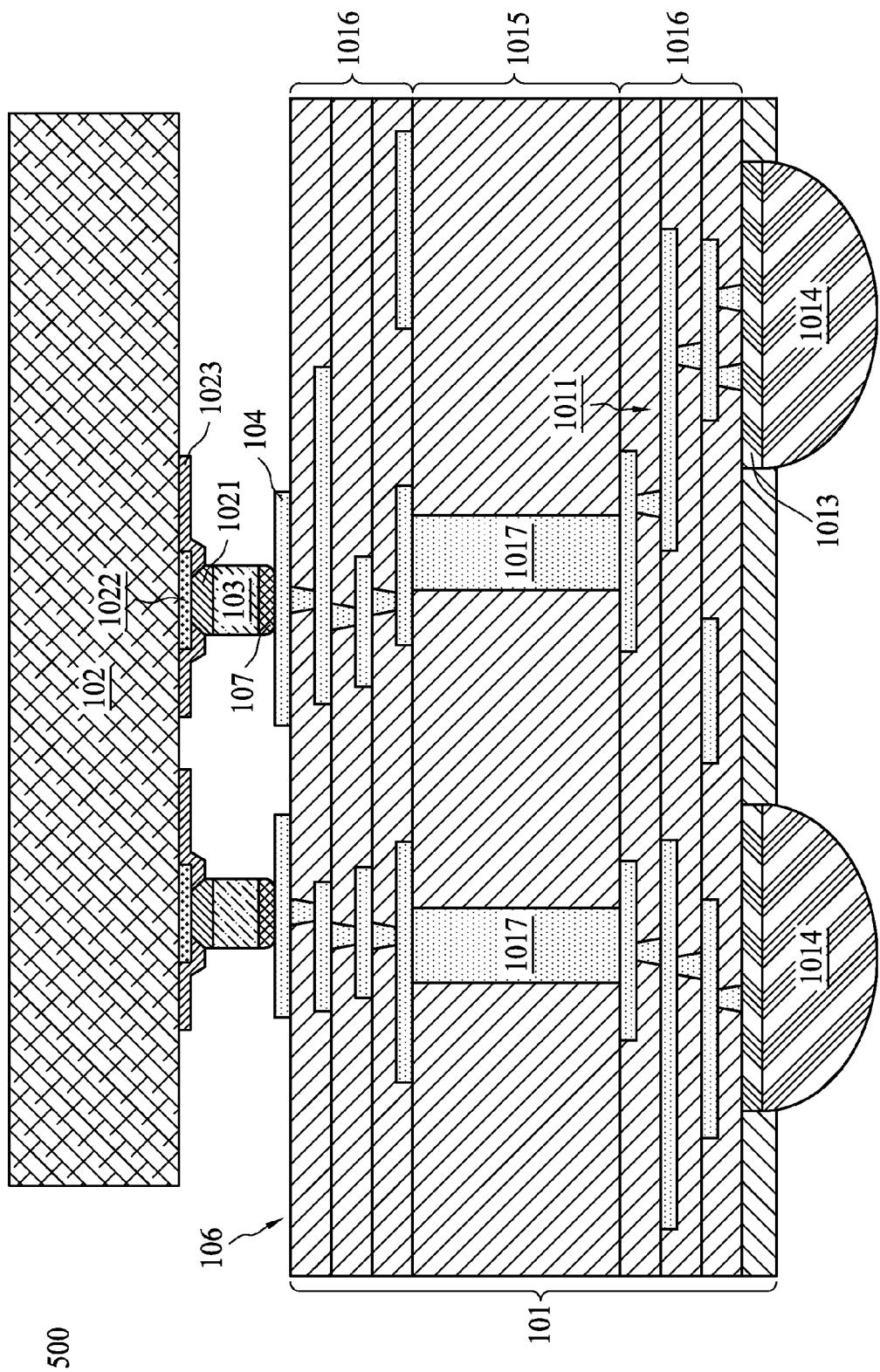
FIG. 6 is a cross-sectional view illustrating a semiconductor structure in accordance with FIG. 5 of the present disclosure.
Figure 7:
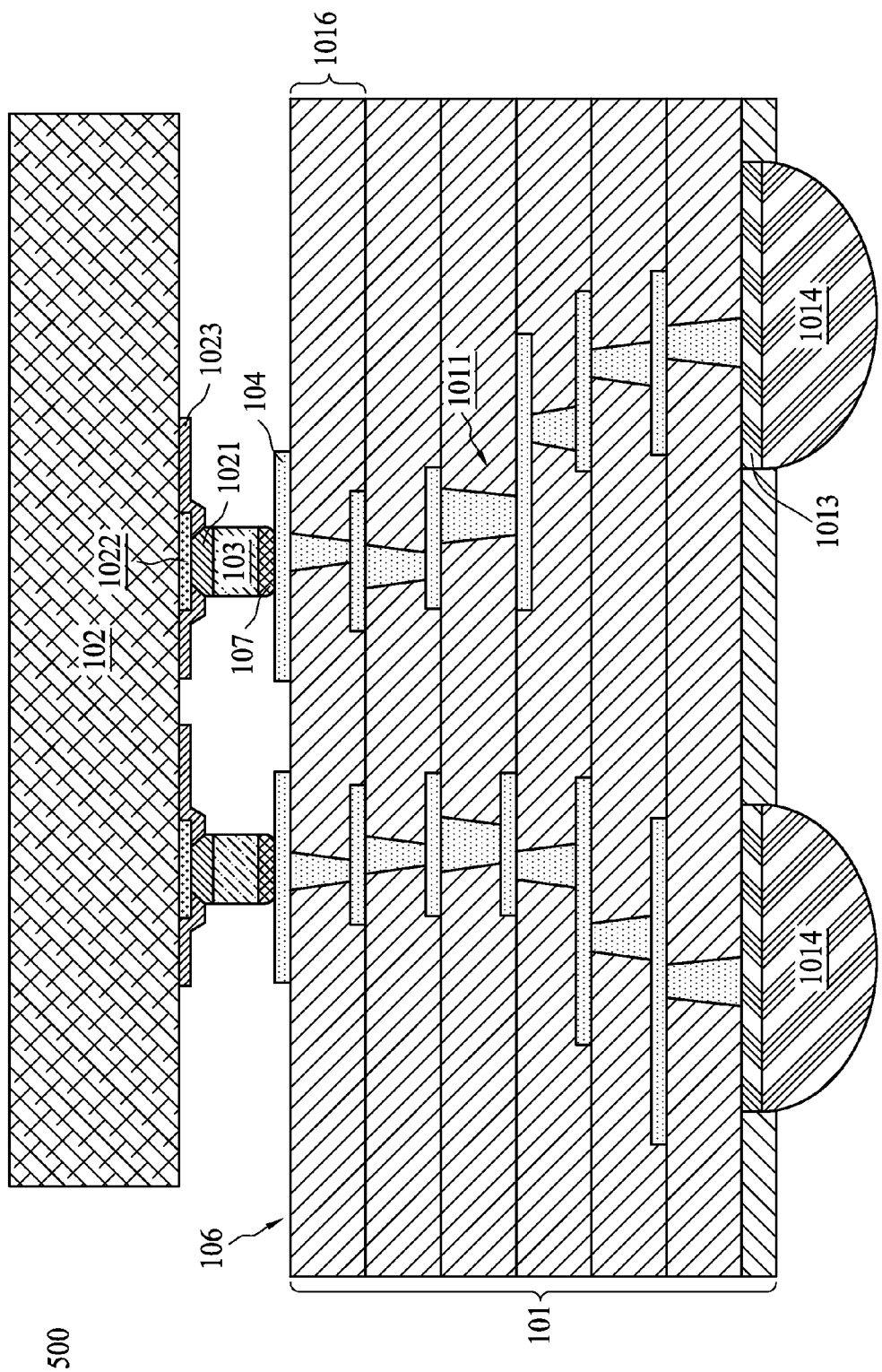
FIG. 7 is a cross-sectional view illustrating a semiconductor structure in accordance with FIG. 5 of the present disclosure.

FIG. 6 is a cross-sectional view illustrating the semiconductor structure 500 of FIG. 5 in accordance with some embodiments of the present disclosure. The substrate 101 comprises a dielectric core structure (layer) 1015 and buildup structures (laminates) 1016. Interconnecting the two buildup structures 1016 through the core structure 1015 is accomplished through plated through holes 1017. The buildup structures 1016 may comprise conductive elements 1011 for interconnection to the conductive trace 104 or the solder ball 1014. FIG. 7 is a cross-sectional view illustrating the semiconductor structure 500 of FIG. 5 in accordance with some embodiments of the present disclosure. The substrate 101 comprises a plurality of buildup structures 1016 without a core structure (i.e., the substrate 101 is a coreless substrate). Since the coreless substrate 101 does not have any plating through hole, the wiring density of the coreless package substrate is increased. In addition, the absence of a core structure makes it easy to reduce overall thickness of the substrate 101.

Figure 8:
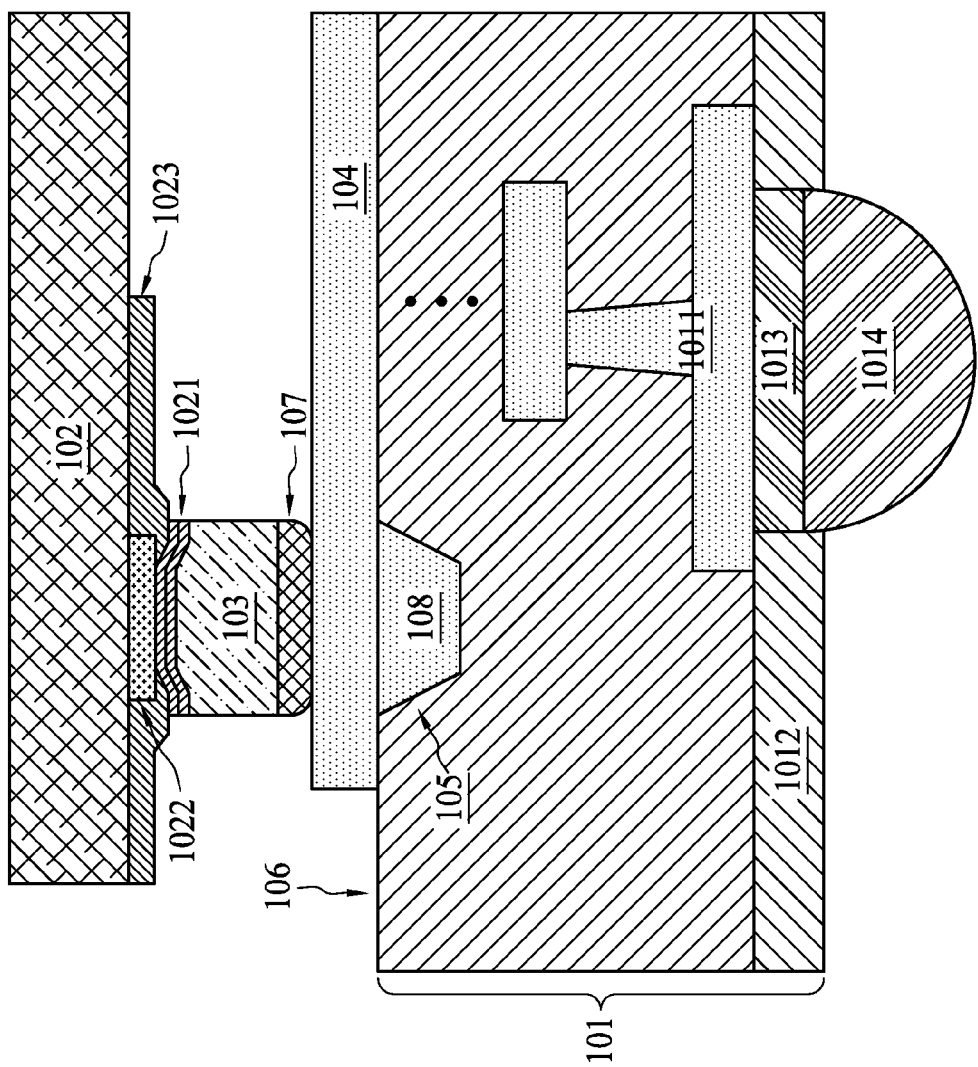
FIG. 8 is a cross-sectional view illustrating a semiconductor structure in accordance with some embodiments of the present disclosure.
Figure 9:
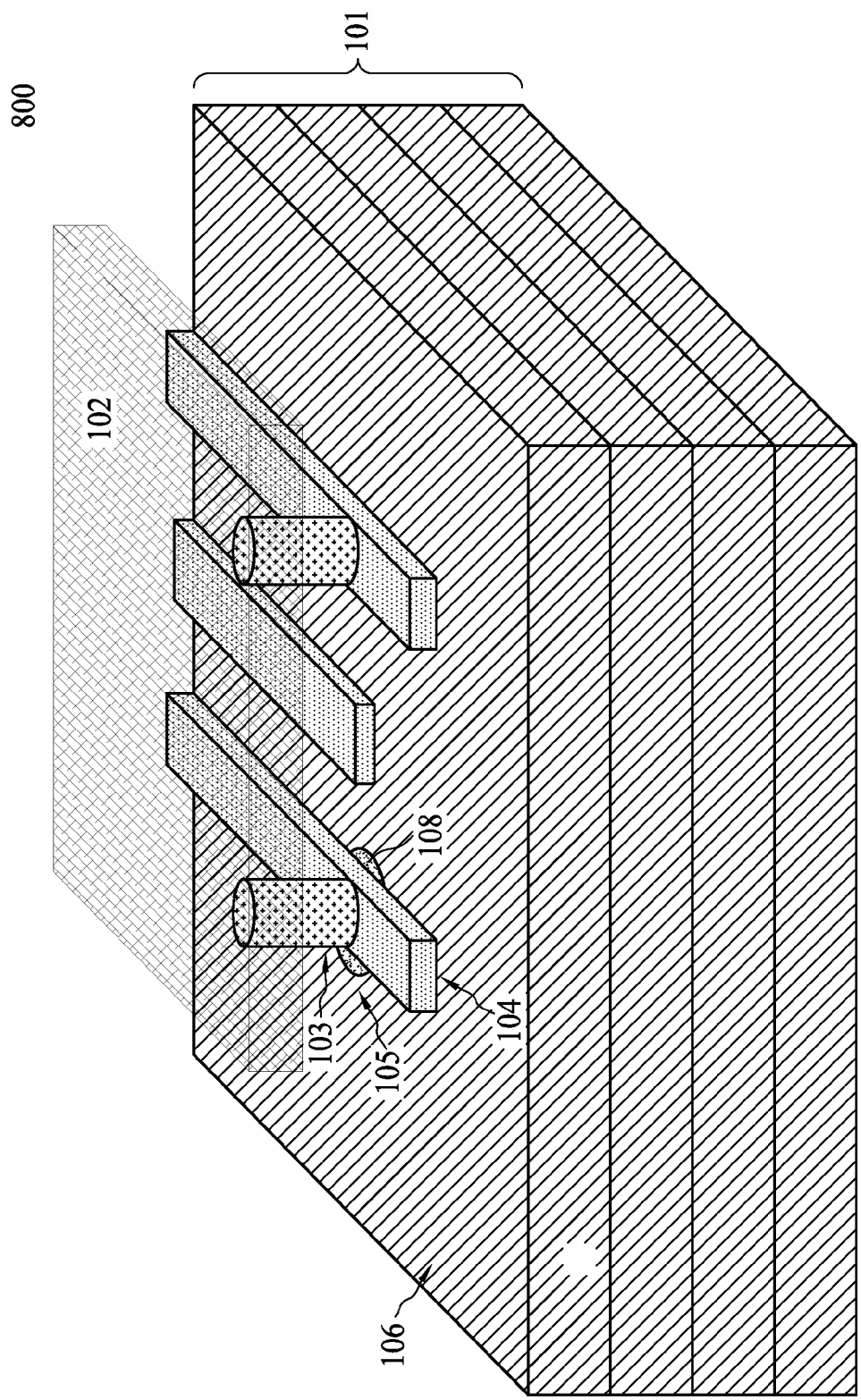
FIG. 9 is a schematic diagram illustrating a semiconductor structure in accordance with FIG. 8 of the present disclosure.

FIG. 8 is a cross-sectional view illustrating the semiconductor structure 800 in accordance with some embodiments of the present disclosure. The semiconductor structure 800 includes a substrate 101. The substrate 101 has a recess portion 105, which is recessed from a surface 106 of the substrate 101 and filled with a conductive material 108. The conductive material 108 may be formed of the same material as the conductive trace 104. A conductive trace 104 is provided on the surface 106 of the substrate 101 and is such arranged that it overlies and directly contacts the conductive material 108 (within the recess portion 105). The conductive pillar 103 can provide an electrical path and a mechanical connection within the semiconductor structure 800. The conductive pillar 103 directly lands on and is coupled to the conductive trace 104 and is disposed proximal to and over the recess portion 105 of the substrate 101 (see FIG. 9). The conductive material 108 within the recess portion 105 greatly enhances the bonding force between the conductive trace 104 and the substrate 101.

In some embodiments, the material(s) for the substrate 101 is such selected that the elastic modulus of the substrate 101 is of about 3 to about 10 GPa at about 20 to about 30° C. In some embodiments, the material(s) for the substrate 101 is such selected that the elastic modulus of the substrate 101 is of about 1 to about 5 GPa at about 250 to about 270° C. In some embodiments, the material(s) for the substrate 101 is such selected as to reduce the high stress produced due to the different coefficients of thermal expansion of the various package substrate and chip materials. In some embodiments, the coefficient of thermal expansion of the substrate 101 is of about 2 to about 8 ppm/° C.

Figure 10:
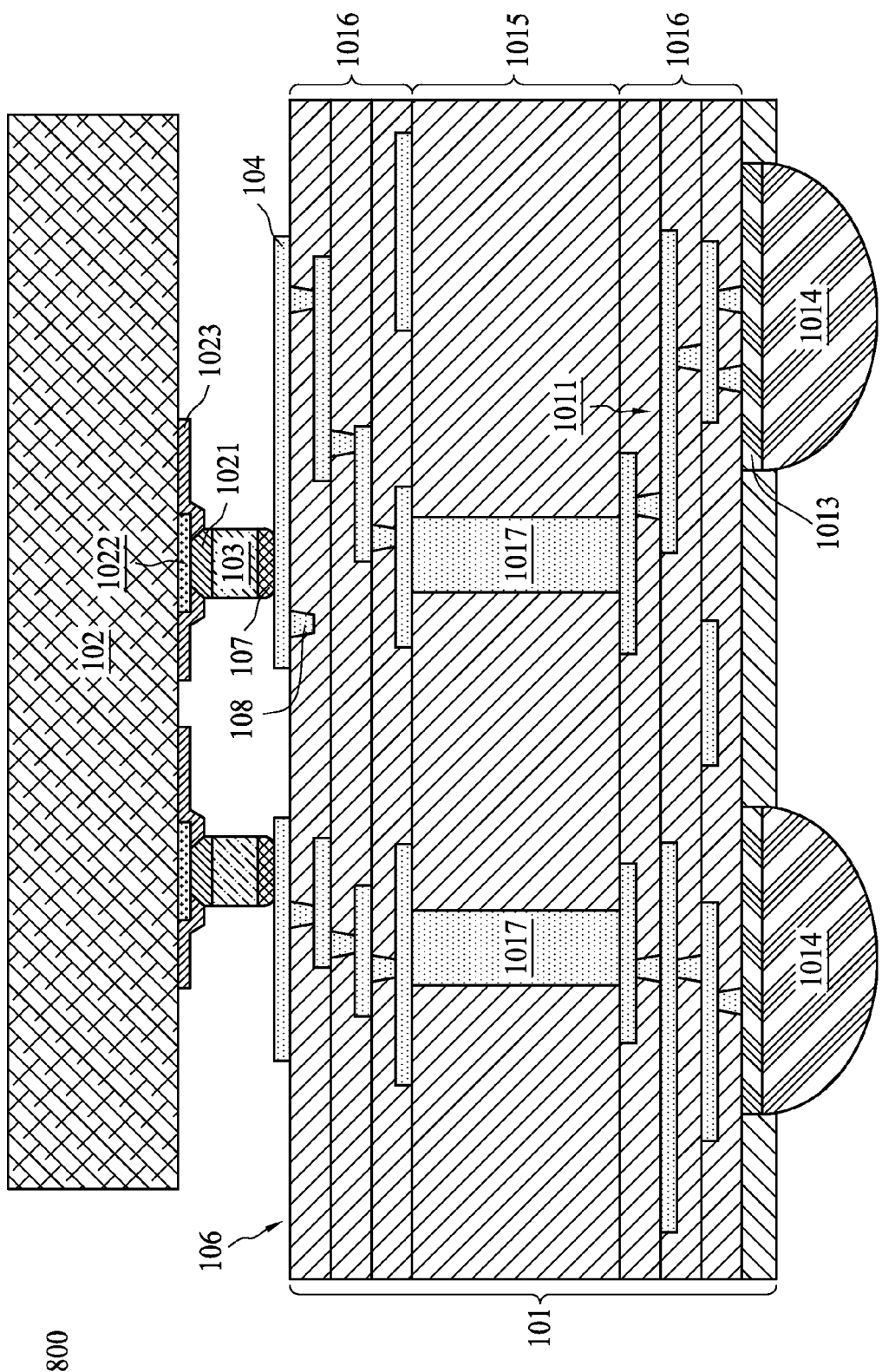
FIG. 10 is a cross-sectional view illustrating a semiconductor structure in accordance with FIG. 8 of the present disclosure.
Figure 11:
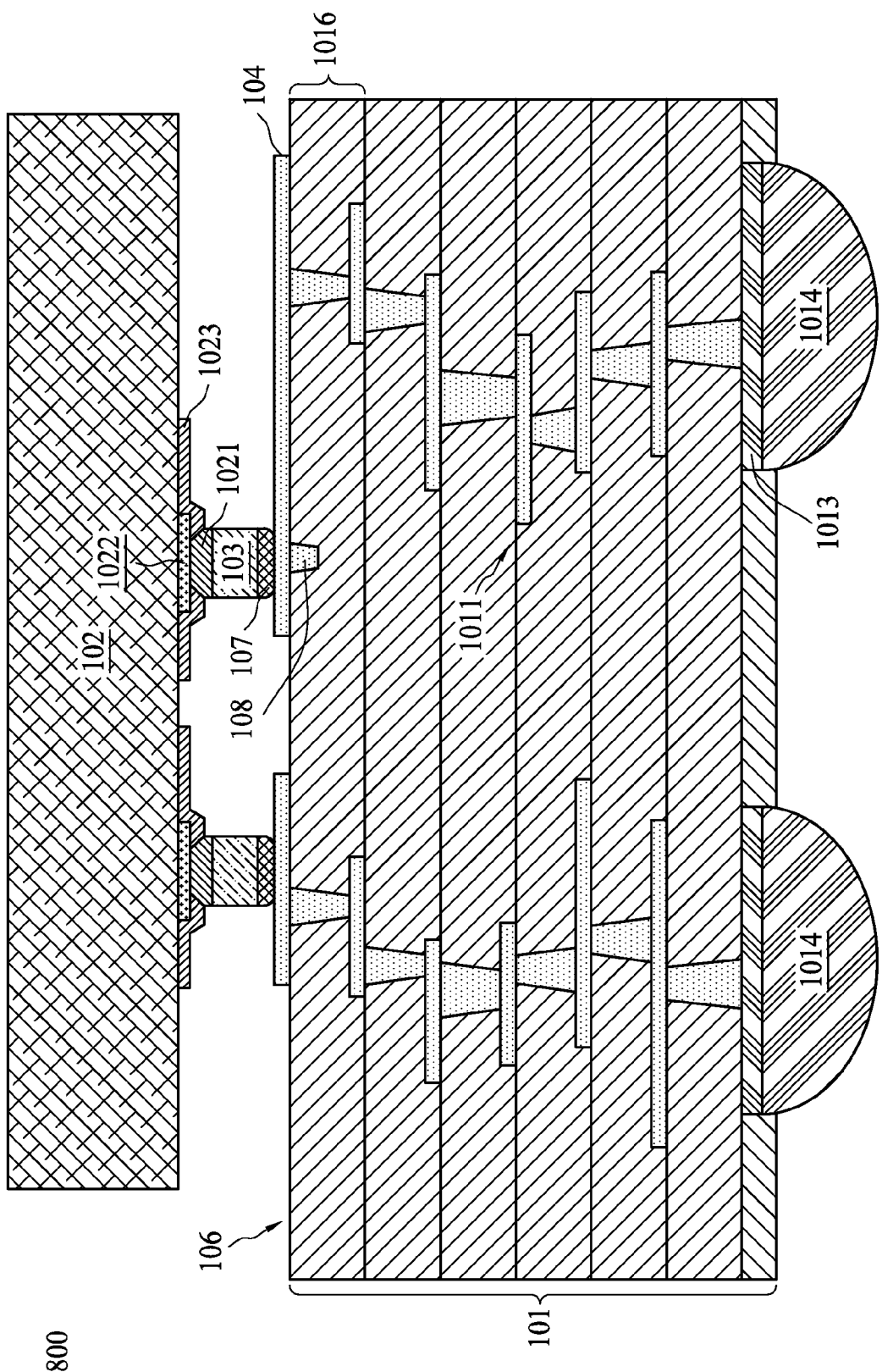
FIG. 11 is a cross-sectional view illustrating a semiconductor structure in accordance with FIG. 8 of the present disclosure.

FIG. 10 is a cross-sectional view illustrating the semiconductor structure 800 of FIG. 8 in accordance with some embodiments of the present disclosure. The substrate 101 comprises a dielectric core structure 1015 and buildup structures 1016. Interconnecting the two buildup structures 1016 through the core structure 1015 is accomplished through plated through holes 1017. The buildup structures 1016 may comprise conductive elements 1011 for interconnection to the conductive trace 104 or the solder ball 1014. In addition, the conductive material 108 within the recess portion 105 (of the buildup structures 1016) greatly enhances the bonding force between the conductive trace 104 and the substrate 101 (the buildup structures 1016) and reduces the risk of peeling off of the conductive trace 104. FIG. 11 is a cross-sectional view illustrating the semiconductor structure 800 of FIG. 8 in accordance with some embodiments of the present disclosure. The substrate 101 comprises a plurality of buildup structures 1016 without a core structure (i.e., the substrate 101 is a coreless substrate). Since the coreless substrate 101 does not have any plating through hole, the wiring density of the coreless package substrate is increased. In addition, the absence of a core structure makes it easy to reduce overall thickness of the substrate 101. In addition, the conductive material 108 within the recess portion 105 (of the buildup structures 1016) greatly enhances the bonding force between the conductive trace 104 and the substrate 101 (the buildup structures 1016) and reduces the risk of peeling off of the conductive trace 104.

Figure 12C:
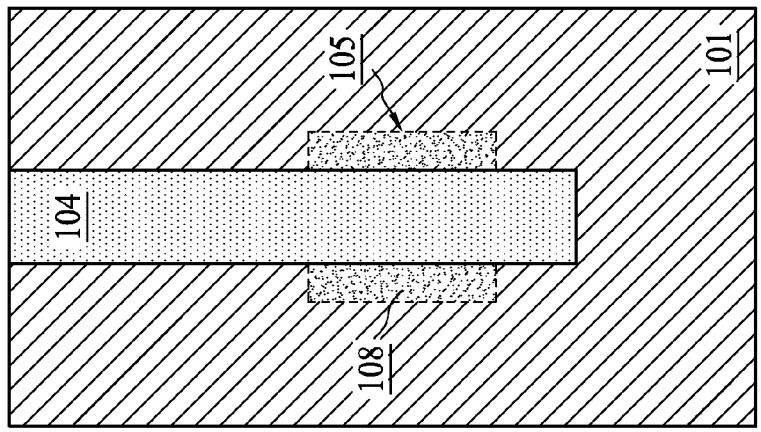
FIGS. 12A-12C are top views illustrating a substrate in accordance with FIG. 8 of the present disclosure.
Figure 12B:
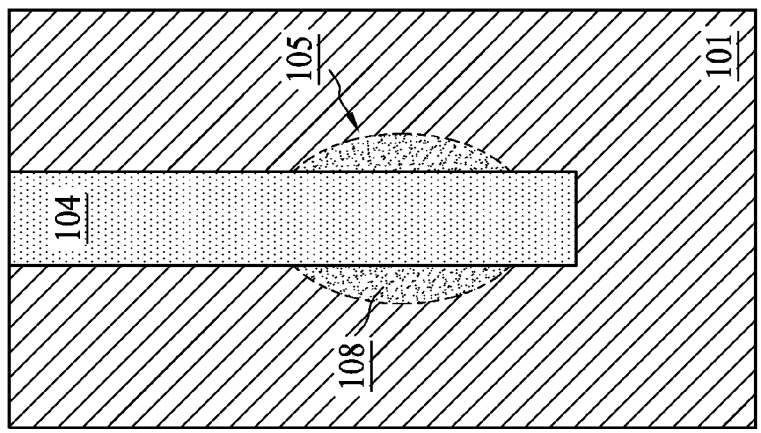
Figure 12A:
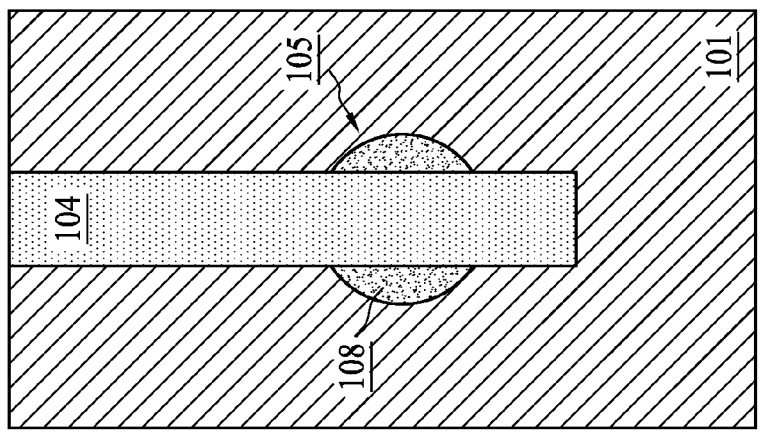

In some embodiments, the recess portion 105 may have different geometric dimensions. The recess portion 105 may be of the shape of a taper, prism or a cylinder. In addition, as shown in FIGS. 12A-12C, the recess portion 105 may be such configured that its projection on the surface 106 of the substrate 101 has different shapes. FIGS. 12A-12C are partial top views of the substrate 101 in FIG. 11 (without the conductive pillar 103 and the semiconductor chip 102). FIGS. 12A-12C show that the conductive trace 104 provided on the surface 106 of the substrate 101 overlies and directly contacts the recess portion 105. As shown in FIG. 12A, the projection of the recess portion 105 on the surface 106 is circular. As shown in FIG. 12B, the projection of the recess portion 105 on the surface 106 is elliptical (oval). As shown in FIG. 12C, the projection of the recess portion 105 on the surface 106 is rectangle. In some embodiments, the projection of the recess portion 105 on the surface 106 includes polygon or other geometric shapes.

Figure 13:
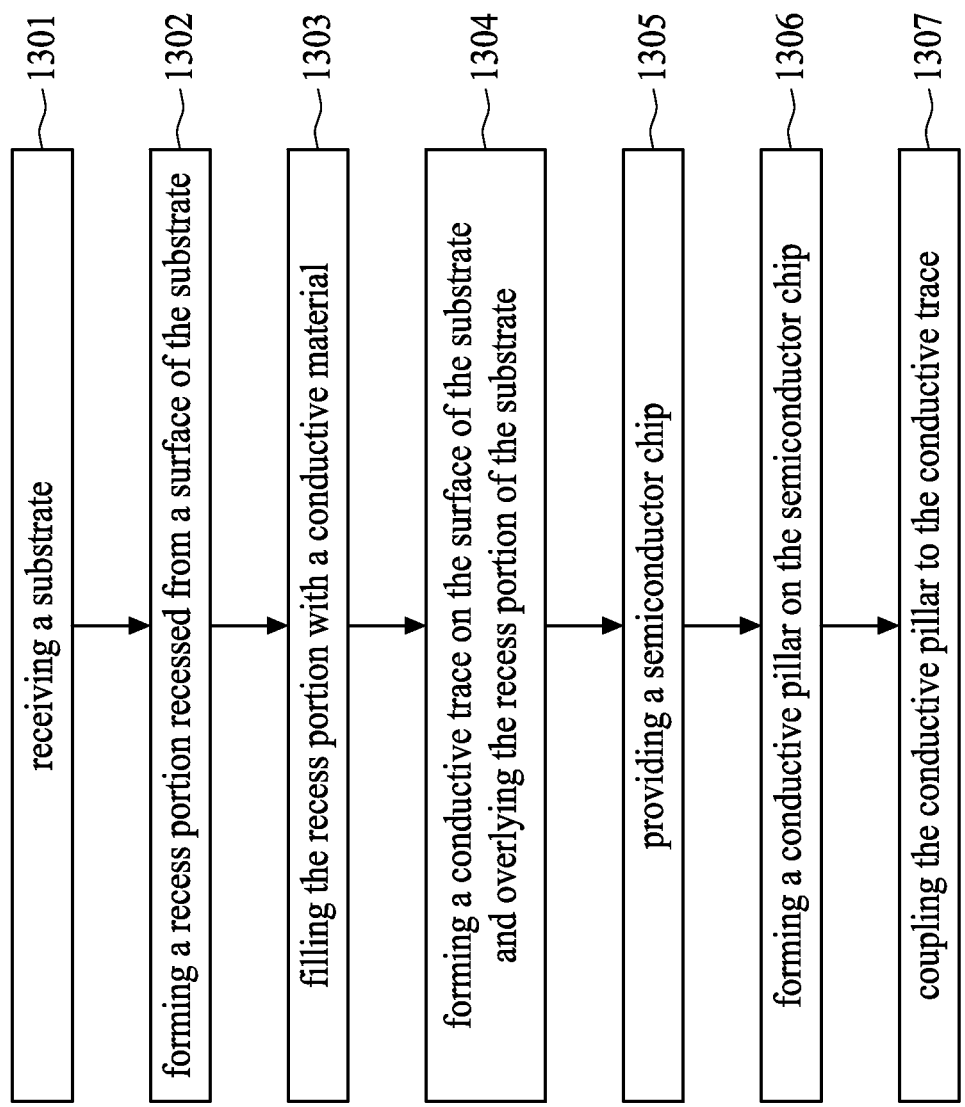
FIG. 13 represents a flow chart of manufacturing a semiconductor structure in accordance with some embodiments of the present disclosure.

FIG. 13 is a flowchart of a method of manufacturing a semiconductor structure as shown in FIG. 8. In operation 1301, a substrate is received. In operation 1302, a recess portion is formed, wherein the recess portion is recessed from a surface of the substrate and may be configured to have different geometrical dimensions. In operation 1303, the recess portion is filled with a conductive material. In operation 1304, a conductive trace is formed on the surface of the substrate, wherein the conductive trace overlies and directly contacts the recess portion. In operation 1305, a semiconductor chip is provided. In operation 1306, a conductive pillar is formed on the semiconductor chip. In operation 1307, the conductive pillar is electrically coupled to the conductive trace.

FIGS. 14A-14G schematically illustrates operations of the method of FIG. 13. In FIG. 14A, a substrate 101 is received. In FIG. 14B, a recess portion 105 is recessed from a surface of the substrate 101. In FIG. 14C, the recess portion 105 is filled with a conductive material 108. In FIG. 14D, a conductive trace 104 is formed on the surface of the substrate 101, wherein the conductive trace 104 overlies and directly contacts the recess portion 105 (or the conductive material 108). In FIG. 14E, a semiconductor chip 102 is provided. In FIG. 14F, a conductive pillar 103 is formed on the semiconductor chip 102. In FIG. 14G, the conductive pillar 103 is electrically coupled to the conductive trace 104 (with a conductor 107) in a BOT configuration. In some embodiments, the material(s) for the substrate 101 is such selected that the elastic modulus of the substrate 101 is of about 3 to about 10 GPa at about 20 to about 30° C. In some embodiments, the material(s) for the substrate 101 is such selected that the elastic modulus of the substrate 101 is of about 1 to about 5 GPa at about 250 to about 270° C. In some embodiments, the material(s) for the substrate 101 is such selected as to reduce the high stress produced due to the different coefficients of thermal expansion of the various package substrate and chip materials. In some embodiments, the coefficient of thermal expansion of the substrate 101 is of about 2 to about 8 ppm/° C.

In some embodiments, the operation 1302 ("forming a recess portion on a surface of the substrate," namely the operation shown in FIG. 14B) comprises etching the surface of the substrate to form the recess portion, in which the surface of the substrate, except the portion of the surface where the recess portion is indented to be located, is protected from the etchant by a masking material (etching mask) which resists etching. The etching process may comprise wet etching and dry etching. For the wet etching process, the exposed surface of a substrate is dissolved when immersed in a bath of liquid-phase ("wet") etchants, which must be agitated to achieve good process control, wherein wet etchants are usually isotropic. For the dry etching process, the exposed surface of a substrate is bombarded by ions (usually a plasma of reactive gases such as fluorocarbons, oxygen, chlorine, boron trichloride; sometimes with addition of nitrogen, argon, helium and other gases). Unlike with many of the wet chemical etchants used in wet etching, the dry etching process typically etches directionally or anisotropically. The dry etching process comprises ion milling (sputter etching), reactive-ion etching (RIE), deep reactive-ion etching (DRIE) and so on.

FIGS. 15A-15G illustrates a method for etching the surface of the substrate to form the recess portion. In FIG. 15A, substrate 101 is provided. In FIG. 15B, a photoresist layer 1501 is formed on a surface of the substrate 101 (i.e., the photoresist layer 1501 is coated on the substrate 101). In FIG. 15C, a photomask 1502 having a predefined pattern (or an opening) is provided on the photoresist layer 1501 and a UV light 1503 is illuminated on the photomask 1502. As shown in FIG. 15D, after illumination, the photoresist layer 1501 is patterned to form an opening where a portion of a surface of the substrate 101 is exposed and then the patterned photoresist layer 1501 is cured. In FIG. 15E, the photomask 1502 is removed. In FIG. 15F, an etching process is applied, wherein the etching process may be a wet etching process using wet chemical etchants or a dry etching process using a plasma of reactive gases, and wherein the patterned photoresist layer 1501 acts as an etching mask and a recess portion 105 is etched and formed on the surface of the substrate 101. In FIG. 15G, the patterned photoresist layer 1501 is stripped off, thereby creating a substrate with a recess portion.

In some embodiments, the operation 1301 ("receiving a substrate," namely the operation shown in FIG. 14A) comprises receiving a coreless substrate. FIGS. 16A-16C illustrates a method for receiving a coreless substrate. In FIG. 16A, a carrier structure (core structure) 1015 is provided. In one embodiment, the carrier structure 1015 may comprise a multi-layer copper foil that may serve as a carrier, such as a microelectronic die carrier. In other embodiments, the carrier material may comprise any suitable conductive carrier material. In an embodiment, the carrier structure 1015 may comprise two layers, but the carrier structure 1015 may comprise one layer or greater than two layers in other embodiments. In FIG. 16B, buildup structures (laminates) 1016 are built up layer by layer on both sides of the carrier structure 1015. The buildup structures 1016 may comprise conductive elements 1011 (e.g., conductive plugs, conductive vias, conductive posts, filler materials or conductive traces) to form conductive path among different layers of the buildup structures 1016. FIG. 16C, the carrier structure 1015 is being removed, and each one of the buildup structures 1016 can served as a coreless substrate.

Some embodiments of the present disclosure provide a semiconductor structure, comprising: a substrate; a conductive bump on the substrate; and a semiconductor chip coupled to the conductive bump, wherein the elastic modulus of the substrate is of about 3 to about 10 GPa at about 20 to about 30° C. and of about 1 to about 5 GPa at about 250 to about 270° C.

Some embodiments of the present disclosure provide a semiconductor structure, including: a substrate; a conductive trace on a surface of the substrate; a conductive bump on the conductive trace; and a semiconductor chip on the conductive bump, wherein the elastic modulus of the substrate is of about 3 to about 10 GPa at about 20 to about 30° C. and of about 1 to about 5 GPa at about 250 to about 270° C.

Some embodiments of the present disclosure provide a method for forming a semiconductor structure, comprising: receiving a substrate; forming a conductive trace on a surface of the substrate; providing a semiconductor chip; forming a conductive pillar on the semiconductor chip; and coupling the conductive pillar to the conductive trace, wherein the elastic modulus of the substrate is of about 3 to about 10 GPa at about 20 to about 30° C. and of about 1 to about 5 GPa at about 250 to about 270° C.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising:
a substrate;
a conductive bump on the substrate; and
a semiconductor chip coupled to the conductive bump, wherein an elastic modulus of the substrate is of 3 to 10 GPa at 20 to 30° C. and of 1 to 5 GPa at 250 to 270° C., a coefficient of thermal expansion (CTE) of the substrate matches a coefficient of thermal expansion (CTE) of the semiconductor chip, and the coefficient of thermal expansion (CTE) of the substrate is of 2 to 8 ppm/° C.

2. The semiconductor structure of claim 1, wherein the substrate is a coreless substrate.

3. The semiconductor structure of claim 1, wherein the substrate is a laminated structure comprising a plurality of thermoplastic resin layers.

4. The semiconductor structure of claim 1, wherein the substrate comprises epoxy resin, polymercaptan curing agent, tertiary amine curing accelerator, or a combination thereof.

5. The semiconductor structure of claim 1, wherein the substrate comprises aralkyl-type epoxy resin with a biphenyl backbone or biphenyl-type epoxy resin.

6. The semiconductor structure of claim 1, wherein the coefficient of thermal expansion (CTE) of the substrate is of 2 to 6 ppm/° C.

7. A semiconductor structure, comprising:
a substrate;
a conductive trace on a surface of the substrate;
a conductive bump on the conductive trace; and
a semiconductor chip on the conductive bump,
wherein an elastic modulus of the substrate is of 3 to 10 GPa at 20 to 30° C. and of 1 to 5 GPa at 250 to 270° C., a coefficient of thermal expansion (CTE) of the substrate matches a coefficient of thermal expansion (CTE) of the semiconductor chip, and the coefficient of thermal expansion (CTE) of the substrate is of 2 to 8 ppm/° C.

8. The semiconductor structure of claim 7, wherein the conductive bump comprises a metal pillar.

9. The semiconductor structure of claim 8, wherein a material for the metal pillar comprises tin, copper, gold, silver, zinc, indium or an alloy thereof.

10. The semiconductor structure of claim 7, wherein the semiconductor chip comprises a CMOS device.

11. The semiconductor structure of claim 7, wherein the substrate comprises a PCB (Printed Circuit Board).

12. The semiconductor structure of claim 7, wherein the substrate is a laminate comprising a plurality of conducting layers and a plurality of insulating layers.

13. The semiconductor structure of claim 7, wherein the coefficient of thermal expansion (CTE) of the substrate is of 2 to 6 ppm/° C.

14. A semiconductor structure, comprising:
a semiconductor chip;
a metal pad on the semiconductor chip;
a conductive bump on the metal pad; and
a substrate coupled to the conductive bump,
wherein an elastic modulus of the substrate is of 3 to 10 GPa at 20 to 30° C. and of 1 to 5 GPa at 250 to 270° C., a coefficient of thermal expansion (CTE) of the substrate matches a coefficient of thermal expansion (CTE) of the semiconductor chip, and the coefficient of thermal expansion (CTE) of the substrate is of 2 to 8 ppm/° C.

15. The semiconductor structure of claim 14, wherein the substrate comprises a plated through hole electrically coupled to the conductive bump.

16. The semiconductor structure of claim 14, wherein the conductive bump is coupled to a conductive trace on a surface of the substrate.

17. The semiconductor structure of claim 16, wherein the conductive bump is coupled to the conductive trace by a conductor.

18. The semiconductor structure of claim 14, wherein the substrate is a coreless substrate.

19. The semiconductor structure of claim 14, wherein the coefficient of thermal expansion (CTE) of the substrate is of 2 to 6 ppm/° C.

* * * * *